United States Patent [19]
Hill et al.

[11] Patent Number: 4,839,614
[45] Date of Patent: Jun. 13, 1989

[54] FREQUENCY REFERENCING SYSTEM AND METHOD

[75] Inventors: Godfrey R. Hill, Ipswich; David W. Smith, Woodbridge, both of England

[73] Assignee: British Telecommunications Public Limited Company, Great Britain

[21] Appl. No.: 71,341

[22] PCT Filed: Sep. 16, 1986

[86] PCT No.: PCT/GB86/00553
§ 371 Date: May 14, 1987
§ 102(e) Date: May 14, 1987

[87] PCT Pub. No.: WO87/01874
PCT Pub. Date: Mar. 26, 1987

[30] Foreign Application Priority Data

Sep. 16, 1985 [GB] United Kingdom ............... 8522821

[51] Int. Cl.$^4$ .................... H01S 3/13; H04J 1/00
[52] U.S. Cl. ..................... 332/7.51; 370/3; 372/32
[58] Field of Search .............. 370/3; 332/7.51; 350/96.11, 96.13, 311, 313; 356/320, 349, 352, 319; 455/609–611; 372/20, 32, 33

[56] References Cited

U.S. PATENT DOCUMENTS

| | | | |
|---|---|---|---|
| 3,967,211 | 6/1976 | Pfzher et al. | 372/32 |
| 4,081,765 | 3/1978 | Berg et al. | 372/32 |
| 4,092,070 | 5/1978 | Smythline | 356/352 |
| 4,096,448 | 6/1978 | Hayes . | |
| 4,150,342 | 4/1979 | Johnston et al. | 372/32 |
| 4,309,671 | 1/1982 | Malyon | 372/32 |
| 4,410,992 | 10/1983 | Javen | 372/32 |
| 4,592,043 | 5/1986 | Williams | 370/3 |
| 4,672,618 | 6/1987 | Wyntjes et al. | 372/32 |
| 4,719,635 | 1/1988 | Yeh | 372/32 |
| 4,748,632 | 5/1988 | Preston | 372/20 |
| 4,771,431 | 9/1988 | Hakazawa et al. | 372/33 |

FOREIGN PATENT DOCUMENTS 2043240 10/1980 United Kingdom ............... 370/3

OTHER PUBLICATIONS

Favre et al., "Frequency Stability of Laser . . . Systems", 8/28/80, Electronics Letters, vol. 16, No. 18, pp. 709–710.

Japanese Journal of Applied Physics, vol. 20, No. 6, Jun. 1981, (Tokyo, JP), H. Tsuchida et al.: "Frequency Stabilization of AlGaAs DH Lasers", pp. L403–L406.

Laser und Optoelectronik, vol. 15, No. 3, Sep. 1983, (Stuttgart DE), G. Meisel: "Stabilizing and Tuning CW Dye Lasers, Part II", pp. 245–251 See FIGS. 2, 6, 7; p. 245, left–hand column, lines 1–25.

Electronique et Microelectronique Industrielle, No. 226, Oct. 15, 1976, (Paris, FR), pp. 28–31 A. Poinsot et al.: "Realisez un Asservissement de Source Hyperfrequence sur une Cavite Resonnante", pp. 28–31.

Electronics Letters, vol. 19, No. 16, Aug. 4, 1983, (London GB), C. J. Nielsen et al.: "New Approach Towards Frequency Stabilization of Linewidth–Narrowed Semiconductor Lasers", pp. 644–646.

*Primary Examiner*—Nelson Moskowitz
*Attorney, Agent, or Firm*—Nixon & Vanderhye

[57] ABSTRACT

A system and method of referencing frequencies of radiation from a plurality of sources, for example lasers (1,2) includes filter element (11), such as a Fabry-Perot etalon, onto which the radiation is incident. The filter element has a replicated set of passbands spaced apart in frequency. Detection means (12, 13) detects radiation passing through the filter element (11) and provides corresponding output signals. Control means (16–18, 3, 4) is responsive to the output signals from the detection means (12, 13) to control the sources (1, 2) so that the radiation transmitted through the filter element (11) is maintained substantially constant. The bandwidths of the radiation are small compared with the corresponding passbands of the filter element. The invention is particularly applicable in a communications network in which a number of sets of remote sources of radiation are referenced to a central set of reference sources.

18 Claims, 3 Drawing Sheets

FREQUENCY REFERENCING SYSTEM AND METHOD

There is an increasing requirement particularly in optical wideband networks closely to control the wavelength or frequency of the transmitted signals. Indeed, the more channels which are transmitted around the network the more important it is to control the frequency of the signals.

In accordance with one aspect of the present invention, a method of referencing the frequencies of radiation from a plurality of sources comprises guiding the radiation to a filter element having a replicated set of passbands spaced apart in frequency; monitoring radiation transmitted through the filter element; and controlling the sources so that the radiation transmitted through the filter element is maintained substantially constant, the bandwidths of the radiation being smaller than the corresponding passbands of the filter element.

In accordance with a second aspect of the present invention, a frequency referencing system comprises a plurality of sources of radiation of different frequencies; a filter element on to which the radiation is incident, the element having a replicated set of passbands spaced apart in frequency; detection means for detecting radiation passing through the filter element and for providing corresponding output signals; and control means responsive to the output signals from the detection means to control the sources so that the radiation transmitted through the filter element is maintained substantially constant, the bandwidths of the radiation being smaller than the corresponding passbands of the filter element.

The invention provides a particularly simple way to lock the frequencies of the radiation from the sources relatively to one another. It is thus particularly suitable, when the radiation is optical radiation, in optical wideband networks as described above.

The invention is also applicable to radiation at non-optical frequencies such as radio and microwaves.

The monitoring step may comprise monitoring the intensity of the transmitted radiation. In this case the bandwidths of the radiation are preferably offset from the central frequency of the corresponding passbands of the filter element and particularly conveniently they are positioned close to the edge of the corresponding passbands. The advantage of this is that any change in relative position between the radiation frequency and the filter element passband will correspond with an increase or decrease in the intensity of the radiation transmitted through the filter element depending on the direction of the change.

Alternatively, the phase of the transmitted radiation may be monitored. In this case the radiation bandwidth may be substantially centered on the corresponding passband and any change in the relative positions of the radiation frequency and the passband will result in a phase change in the transmitted beam the type of phase change differing with the direction of movement between the radiation frequency and passband. The advantages of this are that there is no attenuation since the beam is centered on a passband, and any dc drifts will not affect performance since phase and not intensity is monitored.

In some cases, the passbands of the filter element will shift together in response for example to temperature changes. Preferably, therefore one source comprises a reference source for generating a reference beam, the method further comprising monitoring transmitted radiation corresponding to the reference beam, and adjusting the filter element to maintain the transmission characteristic of the reference beam substantially constant. For example, the system may include means for adjusting the filter element in response to output signals from the detection means corresponding to radiation from the reference source.

The adjusting means may comprise means for physically moving or stressing the filter element such as a piezo transducer or a stepper motor or means for adjusting the temperature of the filter element or its support such as a Peltier cooler.

Preferably, the passbands of the filter element are substantially equally spaced apart in frequency.

The filter element may be provided in the case of optical radiation by an optical waveguide loop or ring resonator which passes radiation having the fundamental frequency of the loop and also higher resonant frequencies but is most conveniently provided by a Fabry-Perot etalon. An etalon has a power transfer characteristic, usually at optical frequencies, which exhibits passbands at regular frequency intervals over a wide frequency range. The width of the passbands and their spacing are determined by the mechanical dimensions of the etalon and by the materials and coatings. Etalons may be made for example by using silica glass or air spaced devices. Integrated optic or fiber based devices may be used to achieve a similar effect. The spacing between passbands may range from for example 10's of MHz to several nm.

In one example, the radiation from each source may be incident on different parts of the filter element. This enables the different radiation beams to be easily distinguished but requires the use of a corresponding plurality of detectors.

Preferably, therefore, radiation from the plurality of sources is guided along the same path to the filter element, common detection means being provided to receive the radiation transmitted through the filter element, and the control means being arranged to impart respective identifiers to the radiation from each source and to detect from the radiation passing through the filter element each identifer and the radiation corresponding to the identifier.

The identifier may comprise a frequency or time code modulation.

Typically, the sources will comprise lasers.

In some cases, it may be desirable to provide several sets of sources whose frequencies are referenced to each other, the sets of sources being widely spaced apart physically. The frequencies of these sets of sources could be referenced by providing a reference source whose output is fed to each set of reference sources each of which is provided with its own filter element. However, this requires that each filter element is perfectly matched and in an optical communications network any mismatch could adversely affect switching or transmission performance.

Conveniently, a communications network comprises a frequency reference system in accordance with the second aspect of the invention in which each source of radiation comprises a reference source, multiplexing means for multiplexing the frequency referenced radiation from the reference sources and splitting means for splitting the multiplexed radiation into a plurality of subsidiary signals each of which is fed to a respective set of remote sources of radiation; and subsidiary control means at each set of subsidiary sources for referencing the frequencies of the radiation from the subsidiary sources to one or more of the reference frequencies supplied from the splitting means.

Some examples of systems and methods in accordance with the present invention will now be described with reference to the accompanying drawings which are schematic block diagrams, and in which.

Figure 1:
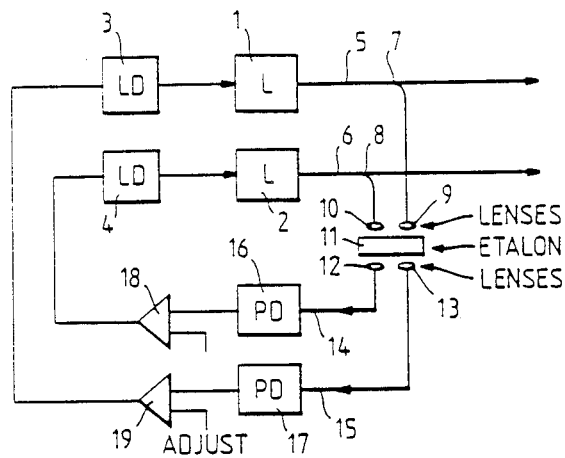
FIG. 1 illustrates one example of the invention.

FIG. 1 illustrates two lasers 1,2 driven by respective laser drivers 3, 4 which generate optical output signals having bandwidths centered on two different frequencies. The optical signals are guided along optical waveguides 5, 6, such as optical fibers, to respective fiber splitters 7,8. A portion of the signal fed to each splitter 7, 8 is diverted to respective converging lenses 9, 10. Light from the lenses 9, 10 is focused onto a Fabry-Perot etalon 11 at spaced apart locations. Optical radiation which passes through the etalon 11 is received by respective converging lenses 12, 13 and guided along optical fibers 14, 15 to respective photodiodes 16, 17.

The photodiodes 16, 17 provide electrical outputs corresponding to the intensity of the light passing along the optical fibers 14, 15, the electrical outputs being fed to comparators 18, 19.

Figure 2:
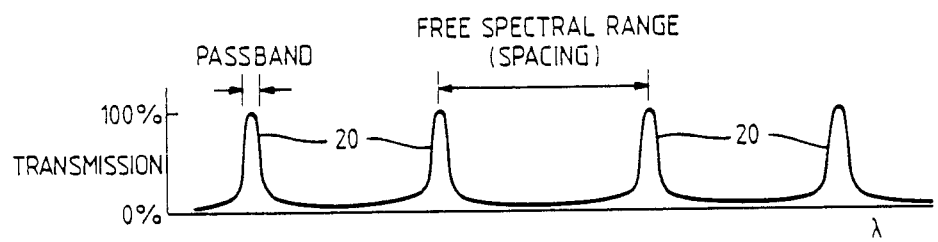
FIG. 2 illustrates the transmission characteristics of the filter element shown in FIG. 1.

The transmission characteristic of the etalon 11 is illustrated in FIG. 2. This indicates that the etalon 11 has a plurality of passbands 20 substantially equally spaced in frequency. The spacing between the passbands 20 may range from 10's of MHz to several nm.

If the output signal from one of the lasers 1,2 has a frequency falling within one of the passbands 20 it will be transmitted through the etalon 11, the intensity of the transmitted signal depending upon the frequency of the signal relative to the passband. In fact, it is preferable if the frequency of the optical signal is not exactly centered within the passband 20 so that any change in the intensity of the transmitted signal can be correlated easily with the direction of relative movement of the passband and the optical signal frequency.

In an alternative arrangement (not shown) either the laser output is frequency modulated or the etalon frequency spacing is modulated and the photodiodes 16, 17 are followed by phase detectors. In either case, the frequency of the optical signals may be centered on corresponding passbands and in either case the interaction of the radiation and optical filter causes intensity changes in the received signal. The amplitude of the detected sub-carrier indicates the instantaneous difference between laser frequency and etalon passband and the phase indicates the relative direction of movement.

The control of the laser 1 will now be described in detail and it should be understood that similar steps would be carried out to control the laser 2. Initially, a desired output frequency for the optical signal from the laser 1 is set. This output frequency must fall within one of the passbands of the etalon 11 so that in use a signal will be received by the photodetector 17. When the frequency of the optical signal for the laser 1 is at the desired magnitude a reference input to the comparator 19 is set so that the laser driver 3 controls the laser 1 to output an optical signal of the required frequency. If there is a change in the frequency of the signal from the laser 1 due for example to changes in temperature the signal passing into the waveguide 15 will have a different intensity from its desired value. An electrical signal corresponding to the intensity of the incoming optical signal is generated by the photodiode 17 and is fed to the comparator 19. Since the comparator 19 will detect a difference between the signal from the photodiode 17 and the reference signal it will cause an appropriate electrical signal to be fed to the laser driver 3 to adjust the frequency of the optical signal generated by the laser 1. In this way, the output signal from the laser 1 is maintained at a substantially constant frequency.

The laser 2 is similarly controlled but at a frequency corresponding to a different passband of the etalon 11. Since the spacing in frequency between the passbands of the etalon 11 is substantially fixed, the output signals from the lasers 1, 2 will also remain fixed relatively to one another despite changes in temperture or other effects.

Figure 3:
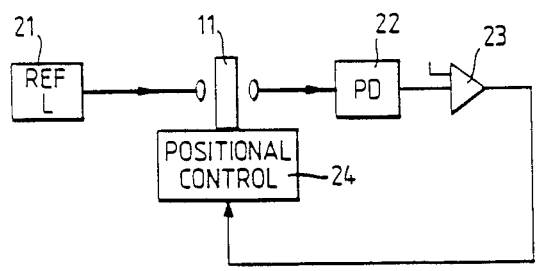
FIG. 3 illustrates a modification of the example shown in FIG. 1.

For a given etalon, the precise spacings between passbands may vary with temperature. If in FIG. 1, temperature changes cause the etalon frequency to shift then, because of the control loops, both lasers 1, 2 will follow the shift and preserve their relative frequency. However, in some applications an absolute stability may be needed which is beyond the stability limits of the etalon. Improved stability may be obtained by means of a control loop in which the angle of the etalon 11 is controlled with respect to the optical axis. This is illustrated in FIG. 3. Tilting the etalon 11 in this way causes a slight change in the device optical path length and hence a change in resonant frequency and will thus restore the passbands of the etalon to their original positions or frequencies.

In this modification, the etalon 11 itself is locked onto a more stable reference such as a HeNe laser 21 or to a laser locked to an atomic reference. As in the FIG. 1 example, the optical output signal from the laser 21 is guided to the etalon 11 and the transmitted signal is received by a photodiode 22. This is fed to a comparator 23 whose output is fed to a positional control unit 24. The positional control unit could be either a piezo transducer of a stepper motor.

A particularly attractive method of stabilizing the etalon 11 is to place a crystal of $LiNbO_3$ in between the partially reflecting mirrors of the etalon. By controlling the electric field across the $LiNbO_3$ the optical path length may be varied. This approach would remove the need for mechanical movement of the etalon 11.

Figure 4:
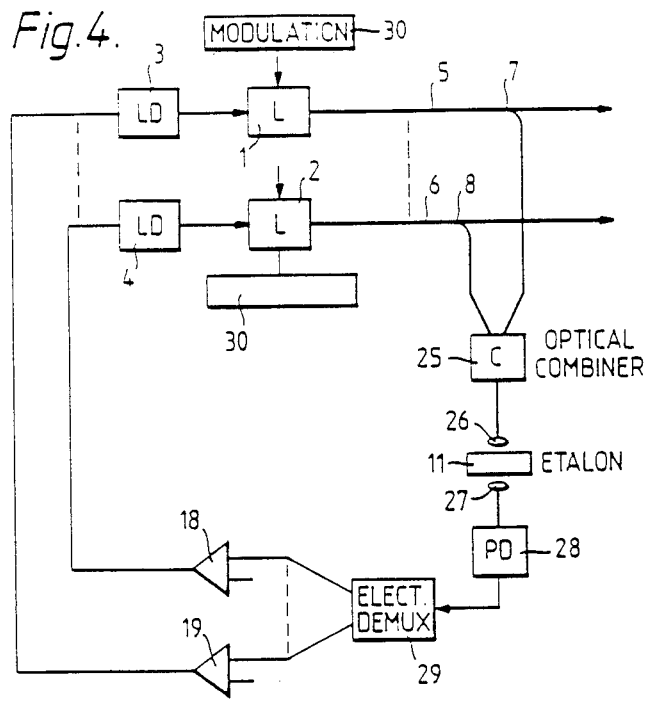
FIG. 4 illustrates a second example.

The FIG. 1 example and indeed its modification require that each optical signal from the lasers is fed to a different part of the etalon 11. This requires that separate photodiodes are provided for each laser. An alternative example which simplifies the construction of the etalon and reduces the number of photodiodes required is illustrated in FIG. 4. In this example, a plurality of lasers are provided (only two of which are shown in the drawing) whose output signals are fed to fiber splitters so that a portion of the output signals are guided to an optical combiner 25. The output of the optical combiner 25 is fed to a single converging lens 26, through the etalon 11 to a single lens 27 and from the lens 27 to a common photodiode 28. The electrical output from the photodiode 28 is fed to an electrical demultiplexer 29 having one output for each of the lasers.

To distinguish between the optical signals from each laser, a modulator 30 is associated with each laser, the modulators 30 imparting a unique identification modulation to the output signals from the lasers. The modulation could be, for example either by frequency or time. If frequency is used then a unique frequency code is allocated to each laser, if time, then a unique time slot or time code is allocated. The electrical demultiplexer 29 senses the identification modulation and provides electrical output signals relating to the intensity of the radiation corresponding to each identification modulation.

Figure 5:
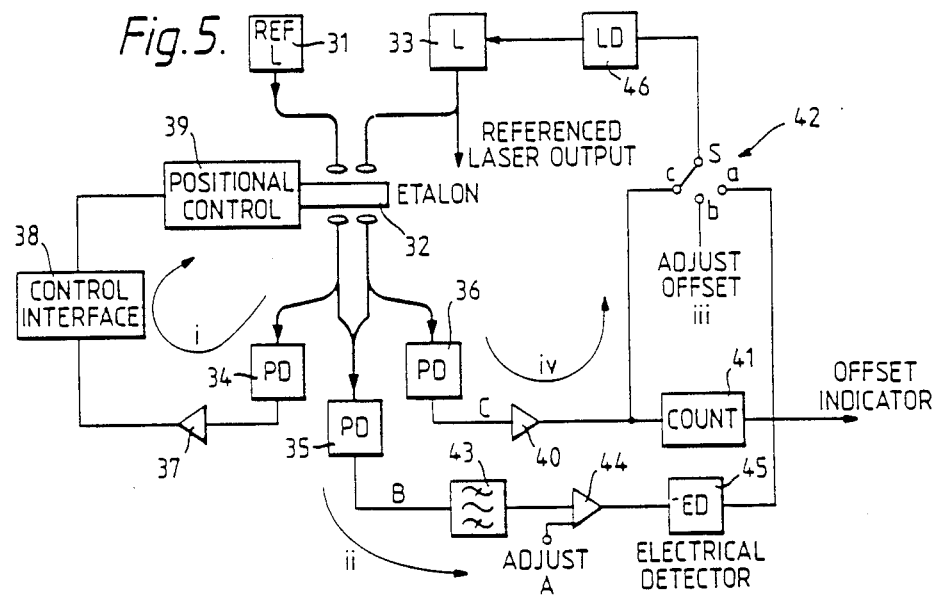
FIG. 5 illustrates a third example.

FIG. 5 illustrates a system for locking a laser to a reference laser based on the FIG. 1 example and the modification of FIG. 3. A reference laser 31 such as a HeNe laser provides a reference optical signal which is fed to an etalon 32. The output signal from a laser 33 to be referenced is split so that part of the output signal is also fed to the etalon 32. Optical signals transmitted through the etalon 32 are split with the transmitted reference signal being fed to a photodiode 34 and to a photodiode 35 while the transmitted signal from the laser 33 is fed to a photodiode 36 and to the photodiode 35. The output signal from the photodiode 34 is fed via a buffer 37 and a control interface 38 to a positional control unit 39 similar to that shown in FIG. 3. The output from the photodiode 36 is fed via a buffer 40 whose output is split with one portion being fed to a counter 41 and the other portion to a three position switch 42. The output of the photodiode 45 is fed to a filter 43, a comparator 44, and an electrical detector 45 whose output is also fed to the switch 42. The laser 33 is driven by a laser driver 46.

Operation of this system is as follows:
1. The position of the etalon 32 is locked so that one of its passbands coincides with the reference frequency from the laser 31. This is achieved using the control loop incorporating the photodiode 34 and the positional control unit 39.
2. With the switch 42 in position (a), the frequency of the laser 33 is adjusted by adjusting a control A which feeds one input of the comparator 44 so that the laser 33 produces a beat with the reference signal to produce an electrical IF signal at B. The frequency of the semiconductor laser 33 is now known.
3. The switch 42 is then moved to the position (b) and the semiconductor laser frequency is adjusted to the required wavelength by applying a suitable offset to the laser driver 46. Each time the laser frequency passes through a passband of the etalon 32, a high level signal appears at C. The counter 41 records the number of times this occurs so that, knowing the frequency of the laser 31 and the passband spacing at the etalon 32, the frequency of the laser 33 is also known.
4. When the required frequency is reached, the switch 42 is set to the position (c) and the laser control loop stabilizes the frequency to the required etalon passband as previously described.

Figure 6:
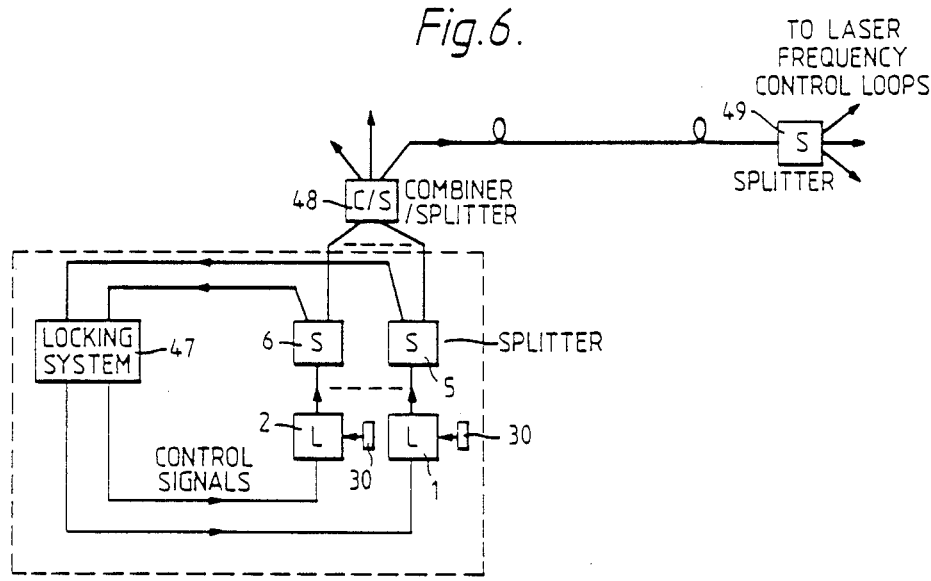
FIGS. 6 and 7 illustrate a fourth example.
Figure 7:
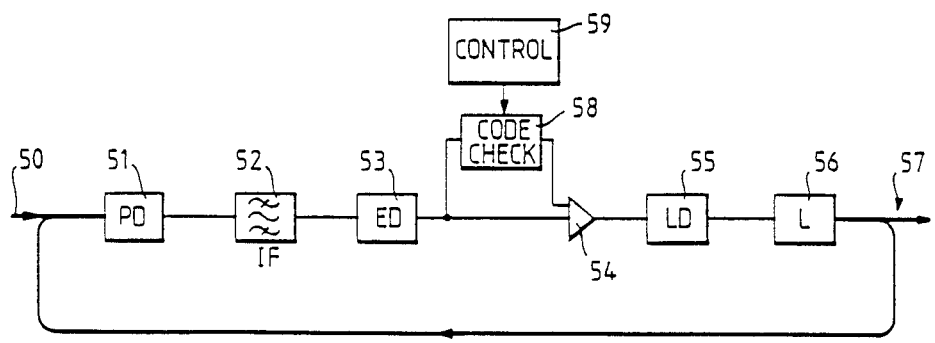

In the preceding examples, the reference laser is shown co-sited with the semiconductor lasers being locked. These schemes would also allow the reference laser to be sited remotely from the locked lasers. Several sets of locked lasers might be sited at different locations remote from the reference laser in which case each set could have its own feeder from the reference laser and its own F-P etalon. In these circumstances, unless the etalons were perfectly matched, small differences in frequency would appear between the locations. In an optical communications network this could adversely affect switching or transmission performance. FIGS. 6 and 7 illustrate an arrangement to deal with this problem.

The section in dashed lines in FIG. 6 corresponds to the FIG. 7 example with a majority of the locking system illustrated schematically at 47. The locked signals from the lasers two of which are indicated at 1, 2, with their identification modulations are fed to an optical combiner/splitter 48 so that the optical signals are combined to form an optical frequency multiplex and then transmitted to a number of remote locations. At each location there is provided an optical splitter 49 having one output for each laser of the set of lasers at that location.

Each laser of the set of lasers is connected in an optoelectronic frequency control loop of the form illustrated in FIG. 7. The multiplexed reference signals are fed from the splitter 49 along an optical fiber 50 to a photodiode 51, an electrical IF processor 52 and an electrical detector 53. The output from the detector 53 is fed to a buffer 54 whose output is fed to a laser driver 55 which controls the laser 56. The output signal from the laser 56 is split at 57 with a portion of the output signal being fed back to the photodiode 51.

Initially, the loop is locked to any one of the reference signals in the incoming multiplexed signal via the path just described. An electrical beat frequency will appear at the output of the photodiode 51 and this is detected. The detected signal will contain the identification modulation corresponding to the reference frequency with which the laser 56 is locked and this identifier is fed to a code check circuit 58. This determines in conjunction with a control unit 59 if and how the local laser 56 should be retuned. An appropriate correction signal is then added to the control signal in the buffer 54 to retune the laser 56 to a required channel. When this is completed, control continues via the direct loop path.

We claim:
1. A method of referencing the frequencies of radiation from a plurality of sources, the method comprising:
  guiding the radiation from each source to a filter element having a replicated set of passbands spaced apart in frequency;
  monitoring radiation at each of the wavelengths transmitted through the filter element; and
  controlling the sources so that the radiation at each wavelength transmitted through the filter element is maintained substantially constant, the bandwidths of the radiation at each wavelength being smaller than the corresponding passbands of the filter element.
2. A method according to claim 1, wherein the intensity of the transmitted radiation is monitored, the bandwidths of the radiation being offset from the central frequency of the corresponding passbands of the filter element.
3. A method according to claim 1, wherein either the radiation frequency is modulated or the frequency spacing of the passbands of the filter element is modulated, the amplitude and phase of the detected sub-carrier being monitored.
4. A method according to anyone of claims 1 to 3, wherein one source comprises a reference source for generating a reference beam, the method further comprising monitoring transmitted radiation corresponding to the reference beam, and adjusting the filter element to maintain the transmission characteristic of the reference beam substantially constant.

5. A method according to anyone of the preceding claims, 1, 2 or 3 further comprising imparting respective identifiers to the radiation from each source; guiding the radiation from each source along a common path to the filter element; detecting from the radiation transmitted through the filter element each identifier; and detecting the radiation corresponding to the identifiers.

6. A method according to claim 5, wherein the identifier comprises a frequency or time code modulation.

7. A method according to anyone of the preceding claims 1, 2 or 3 wherein the radiation is optical radiation.

8. A frequency referencing system comprising:
a plurality of sources of radiation of different frequencies;
a filter element having a replicated set of passbands spaced apart in frequency on to which the radiation from each source is incident;
detection means for detecting the intensity of the radiation at each wavelength passing through the filter element and for providing output signals corresponding to each wavelength; and
control means responsive to the output signals from the detection means to control the sources so that the radiation at each wavelength transmitted through the filter element is maintained substantially constant, the bandwidths of the radiation at each wavelength being smaller than the corresponding passbands of the filter element.

9. A system according to claim 8, wherein one source comprises a reference source the system further including means for adjusting the filter element in response to output signals from the detection means corresponding to radiation from the reference source.

10. A system according to claim 8 or claim 9, wherein the passbands of the filter element are substantially equally spaced apart in frequency.

11. A system according to any one of claims 8 or 9, wherein the filter element comprises a Fabry-Perot etalon or a ring resonator.

12. A system according to anyone of claims 8 or 9, wherein radiation from the plurality of sources is guided along the same path to the filter element, common detection means being provided to receive the radiation transmitted through the filter element, and the control means being arranged to impart respective identifiers to the radiation from each source and to detect from the radiation passing through the filter element each identifier and the radiation corresponding to the identifier.

13. A system according to anyone of claims 8 or 9, wherein the sources comprise lasers.

14. A communications network comprising a frequency referencing system according to anyone of claims 8 or to 9 in which each source of radiation comprises a reference source, multiplexing means for multiplexing the frequency referenced radiation from the reference sources and splitting means for splitting the multiplexed radiation into a plurality of subsidiary signals each of which is fed to a respective set of remote sources of radiation; and subsidiary control means at each set of subsidiary sources for referencing the frequencies of the radiation from the subsidiary sources to one or more of the reference frequencies supplied from the splitting means.

15. A method for simultaneously controlling the operating optical frequencies of plural lasers, said method comprising the steps of:
passing the optical radiation output from each of said plural lasers through a single common optical frequency filter having a plurality of passbands spaced apart in the optical frequency domain, the output of each laser being controllable in frequency to align with a respective one of said passbands in the frequency domain;
processing the optical radiation passed through said filter to derive a plurality of frequency control electrical signals, each of said control electrical signals corresponding to the radiation passed through a respectively corresponding passband of the filter by a respectively corresponding laser; and
using said plural frequency control electrical signals to actively control the operating optical frequency of its respective laser and maintain such operating frequency within its associated filter passband.

16. A method as in claim 15 further comprising the step of
also passing reference optical radiation from a reference laser of predetermined stable operating frequency through said single common optical frequency filter; and
using optical radiation from the reference source passed by the filter to actively control the frequency of the plural filter passbands.

17. A system for simultaneously controlling the operating optical frequencies of plural lasers, said system comprising:
plural controllable frequency laser sources of optical radiation;
a common optical frequency filter disposed to intercept radiation emanating from each of said laser sources, said filter having a plurality of passbands spaced apart in the optical frequency domain;
feedback control circuits for converting radiation passed by said filter into a plurality of electrical control signals, each being representative of the alignment of a respectively associated filter passband and laser output frequency and for applying said electrical signals to control the respective laser output frequencies and thus maintain each with an associated passband of the filter.

18. A system as in claim 17 further comprising:
a reference laser having a stable predetermined operating optical frequency and arranged to direct at least some of its optical output through said filter; and
filter frequency control means connected and disposed to receive reference frequency radiation from the reference laser and passed by the filter and to control the filter to maintain one of its passbands aligned therewith in the frequency domain.

* * * * *